US012690483B2

(12) United States Patent
Ozkan et al.

(10) Patent No.: US 12,690,483 B2
(45) Date of Patent: Jul. 21, 2026

(54) SEMICONDUCTOR CHIP PACKAGE HAVING INTERNAL I/O STRUCTURES WITH MODULATED THICKNESS TO COMPENSATE FOR DIE/SUBSTRATE WARPAGE

(71) Applicant: Intel Corporation, Santa Clara, CA (US)

(72) Inventors: Onur Ozkan, Scottsdale, AZ (US);
Edvin Cetegen, Chandler, AZ (US);
Steve Cho, Chandler, AZ (US);
Nicholas S. Haehn, Scottsdale, AZ (US); Jacob Vehonsky, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 509 days.

(21) Appl. No.: 17/483,621

(22) Filed: Sep. 23, 2021

(65) Prior Publication Data

US 2023/0086649 A1 Mar. 23, 2023

(51) Int. Cl.
| | |
|---|---|
| *H10W 72/00* | (2026.01) |
| *H10W 70/05* | (2026.01) |
| *H10W 70/65* | (2026.01) |
| *H10W 90/00* | (2026.01) |

(52) U.S. Cl.
CPC ....... *H10W 72/072* (2026.01); *H10W 70/092* (2026.01); *H10W 70/65* (2026.01); *H10W 90/00* (2026.01); *H10W 90/724* (2026.01)

(58) Field of Classification Search
None
See application file for complete search history.

(56) References Cited

U.S. PATENT DOCUMENTS

2022/0013492 A1* 1/2022 Huang ................... H01L 24/81

FOREIGN PATENT DOCUMENTS

| | | | | | |
|---|---|---|---|---|---|
| CN | 113380745 A | * | 9/2021 | ............ | H01L 21/50 |
| JP | 2007042762 A | * | 2/2007 | | |

OTHER PUBLICATIONS

Bchir, et al., "Improvement of Substrate and Package Warpage by Copper Plating Process Optimization", IEEE, 2014 Electronic Components & Technology Conference, 5 pages.

* cited by examiner

*Primary Examiner* — Hung K Vu
(74) *Attorney, Agent, or Firm* — Compass IP Law PC

(57) ABSTRACT

An apparatus is described. The apparatus includes I/O structures having pads and solder balls to couple with a semiconductor chip, wherein, a first subset of pads and/or solder balls of the pads and solder balls that approach the semiconductor chip during coupling of the semiconductor chip to the I/O structures are thinner than a second subset of pads and/or solder balls of the pads and solder balls that move away from the semiconductor chip during the coupling of the semiconductor chip to the I/O structures.

16 Claims, 11 Drawing Sheets

SEMICONDUCTOR CHIP PACKAGE HAVING INTERNAL I/O STRUCTURES WITH MODULATED THICKNESS TO COMPENSATE FOR DIE/SUBSTRATE WARPAGE

FIELD OF INVENTION

The field of invention pertains to the mechanical arts, and, more specifically, to a semiconductor chip package having internal I/O structures with modulated thickness to compensate for die/substrate warpage.

BACKGROUND

Both computers and networks continue to pack higher and higher levels of performance into smaller and smaller packages. Packaging engineers therefore have to invent creative package solutions to keep pace with the packaging requirements of such aggressively designed systems and their corresponding components.

FIGURES

A better understanding of the present invention can be obtained from the following detailed description in conjunction with the following drawings, in which.

Figures 6A, 6B:
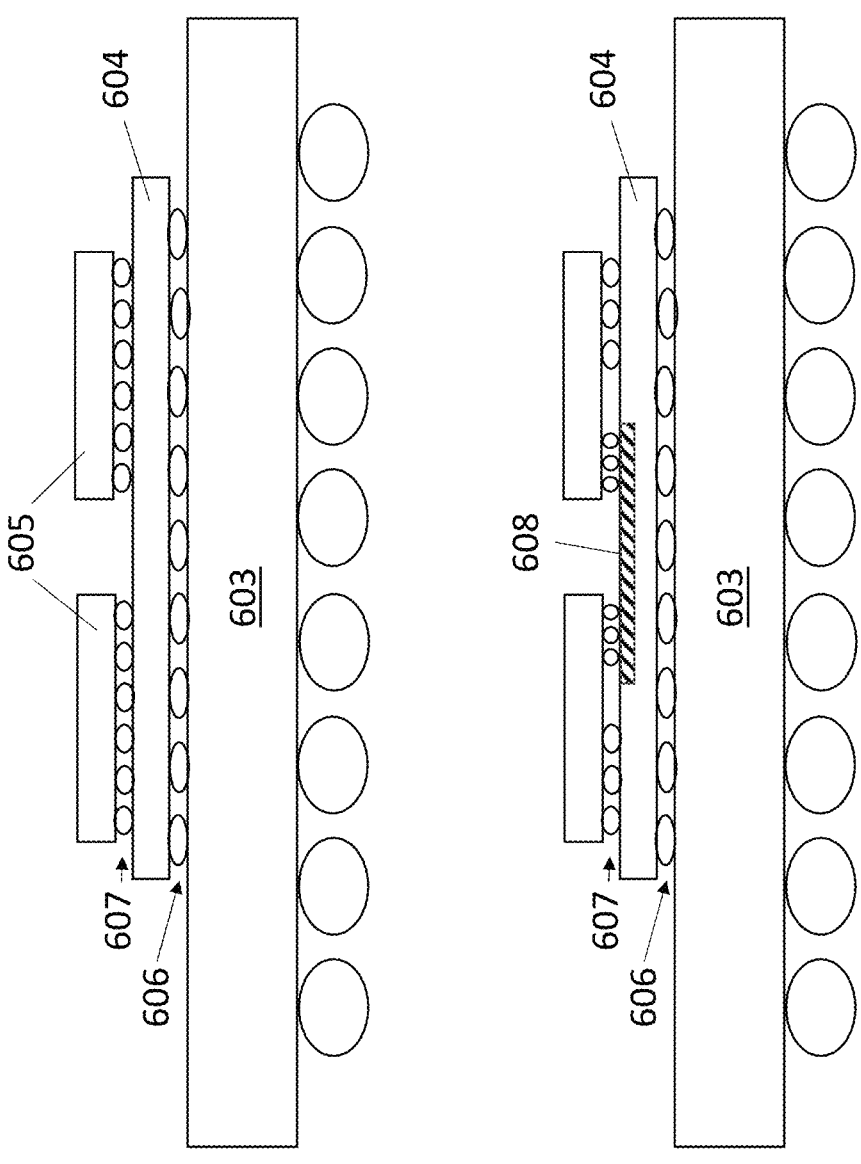
Figure 7:
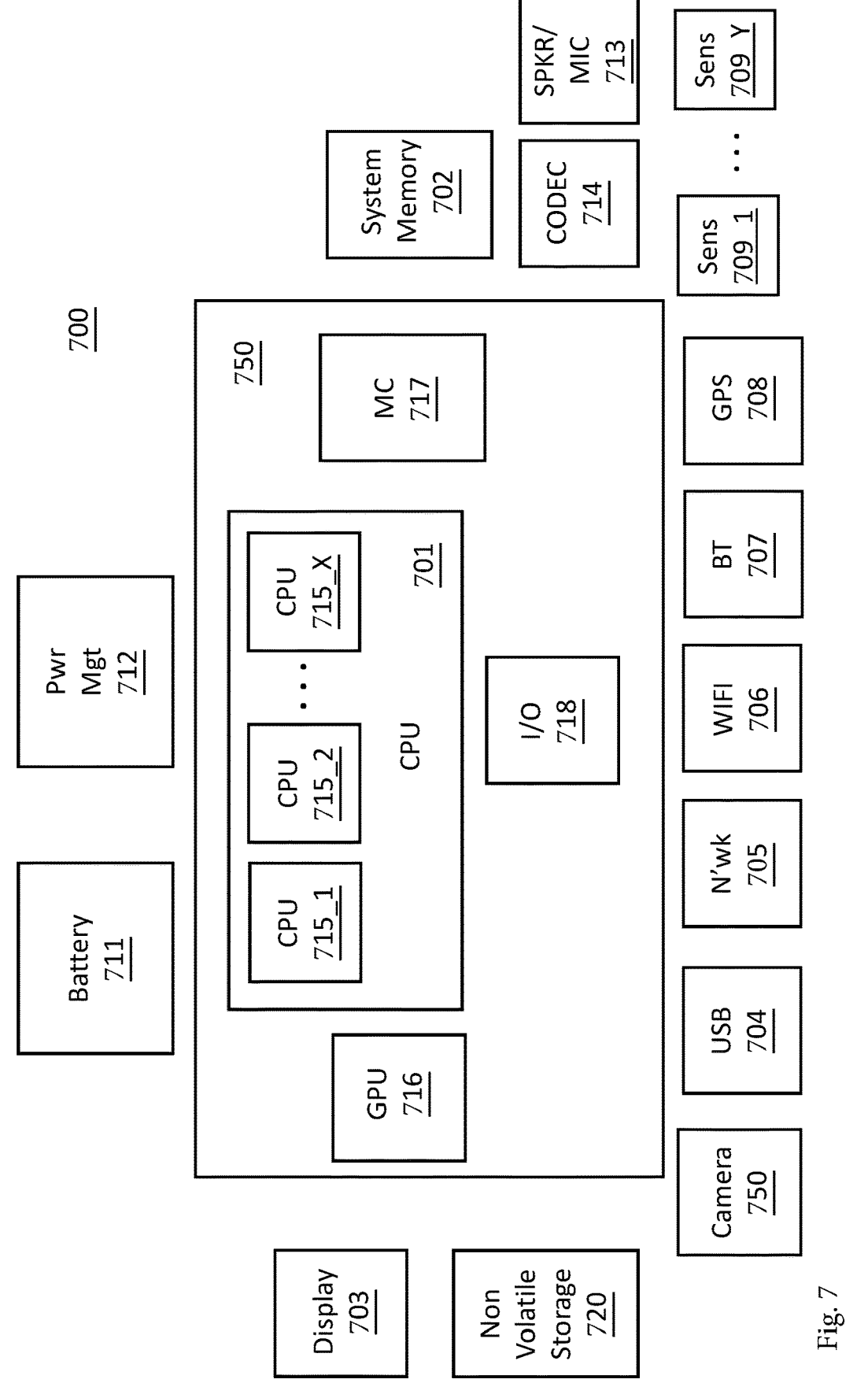

FIGS. 5a, 5b, 5c, 5d and 5e;

FIGS. 6a and 6b show other packages (prior art);

FIG. 7 shows a computing system.

DETAILED DESCRIPTION

Figure 1:
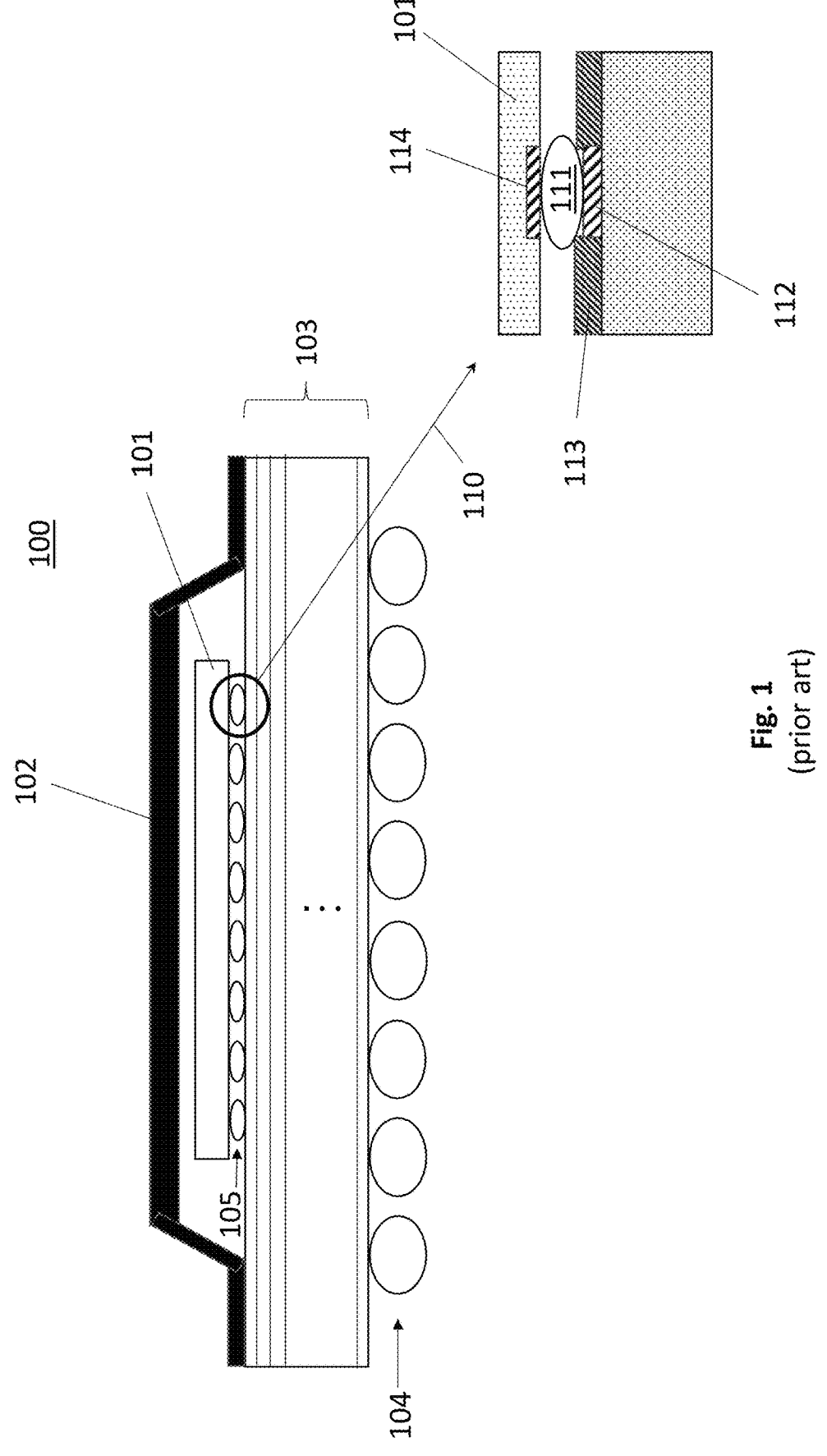
FIG. 1 shows a package (prior art)

FIG. 1 shows a cross section 100 of a packaged semiconductor chip 101. As observed in FIG. 1, the chip package includes a lid 102 (also referred to as integrated heat spreader (IHS)) that is mounted to the package substrate 103. The package substrate 103 is a multi-layer circuit board that connects the package input/outputs (I/Os) 104 to their corresponding chip I/Os 105.

More specifically, the package substrate 103 is a stack of alternating dielectric and metal layers that are specially patterned to form the wires that connect the package I/Os 104 to their corresponding chip I/Os 105. Over time, the number of I/Os 105 per semiconductor chip 101 has steadily increased as the size and complexity of semiconductor chips has increased with each new generation of semiconductor chip manufacturing technology.

A zoom-in of the die/substrate I/O interface is observed at the inset 110 of FIG. 1. As observed in inset 110, the package substrate side of the interface includes a pad 112 (typically composed of copper) with a solder ball or bump 111 formed thereon. The solder ball/bump 111 (hereinafter "ball") is exposed through a solder mask layer 113 that corresponds to the topmost layer of the package substrate.

During the process of attaching the die 101 to the package substrate 103, a corresponding pad 114 on the underside of the die 101 is aligned with the solder ball 111. The temperature is thereafter raised beyond the melting point of the solder ball 111 which melts/reflows the solder. The temperature is then reduced resulting in solidified solder 111 that electrically and mechanically connects the die's pad 114 and package substrate's pad 112 to one another.

In other approaches the solder ball 111 is formed on the die pad 114 instead of the package substrate pad 112, or, there is solder ball on both the die pad 114 and the package pad 112 and both balls are aligned and melted during the attach process. For ease of explanation, most of the remainder of this discussion will refer to the initial approach in which the ball 111 is formed on the package substrate pad 112.

Regardless, it is becoming increasingly difficult to properly attach the die to the package substrate because of the continually increasing number of I/Os on the die 101. Specifically, in order to "fit" larger and large numbers of I/Os on the underside of the die 101, both the sizes of the pads 112, 114 and the sizes of the solder ball 111 are becoming smaller and smaller. That is, the dimensions of the features observed at inset 110 are continually shrinking.

The shrinking of these dimensions translates into smaller mechanically tolerances. Said another way, as the I/O structures become smaller and smaller, minor deviations in the their positioning or size can lead to faulty I/O structures.

A particular concern is die warping and package substrate warping. Here, both the die 101 and the package substrate 103 can warp as a consequence of internal stresses/strains associated with their respective multi-layer structures. Here, both the die and package substrate include multiple layers of patterned dielectrics and metals, each having their own associated coefficient of thermal expansion. The different coefficients of thermal result in a complex myriad of strains and stresses within the die 101 and package substrate 103 in response to thermal changes.

Such stresses/strains can become particularly pronounced in response to the high temperatures that are applied to melt the solder ball 111 during the die attach process described just above. The pronounced stresses/strains result in warping of both the die 101 and the package substrate 103.

Figure 2:
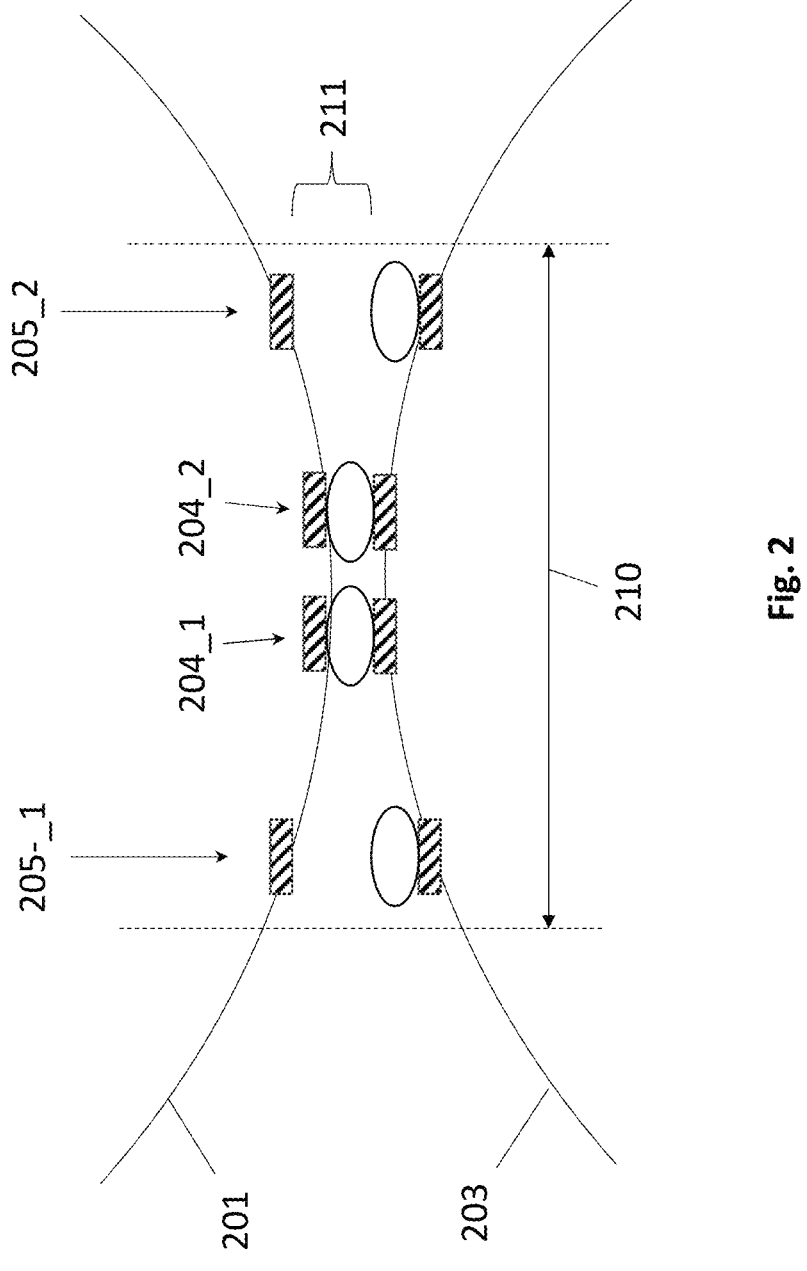
FIG. 2 shows warping of a semiconductor chip and a package substrate.

FIG. 2 depicts an example of the warping that can occur while reflowing the solder 111 during the die attach process. For ease of explanation, the drawing is not to scale, only shows a few I/Os and exaggerates the amount of warping. As observed in FIG. 2, both the die 201 and package substrate warp 203 in a convex fashion facing one another. That is, within the area 210 of the die and package I/Os, the "inner" I/Os (such as I/O pairs 204_1, 204_2) protrude toward one another, whereas, by contrast, the "outer" I/Os (such as I/O pairs 205_1, 205_2) bend away from one another.

As a consequence of the warping, the inner I/Os 204_1, 204_2 make contact with the another, whereas, the outer I/Os 205_1, 205_2 have a sizable distance 211 between them. As such, when the temperature is raised to reflow the solder, only the middle I/Os 204_1, 204_2 have a chance at being properly reflowed. When the die attach process is completed and the temperature cools, the warping subsides such that the outer I/Os 205_1, 205_2 may be in mechanical contact with one another. However, they will not have a proper reflowed solder connection between them.

Essentially, the die attach process results in the outer I/Os 205_1, 205_2 being at risk of forming only a high resistance or open circuit between their respective pads. Additionally, as stated above, the middle I/Os 204_1, 204_2 only have a chance at being properly formed. Depending on neighboring I/O pitch and the amount of warping, etc., the warping can cause neighboring middle I/Os 204_1, 204_2 to crowd into one another, thereby forming an undesired short circuit between the respective I/O pairs 204_1, 204_2 after reflow.

Figure 3A:
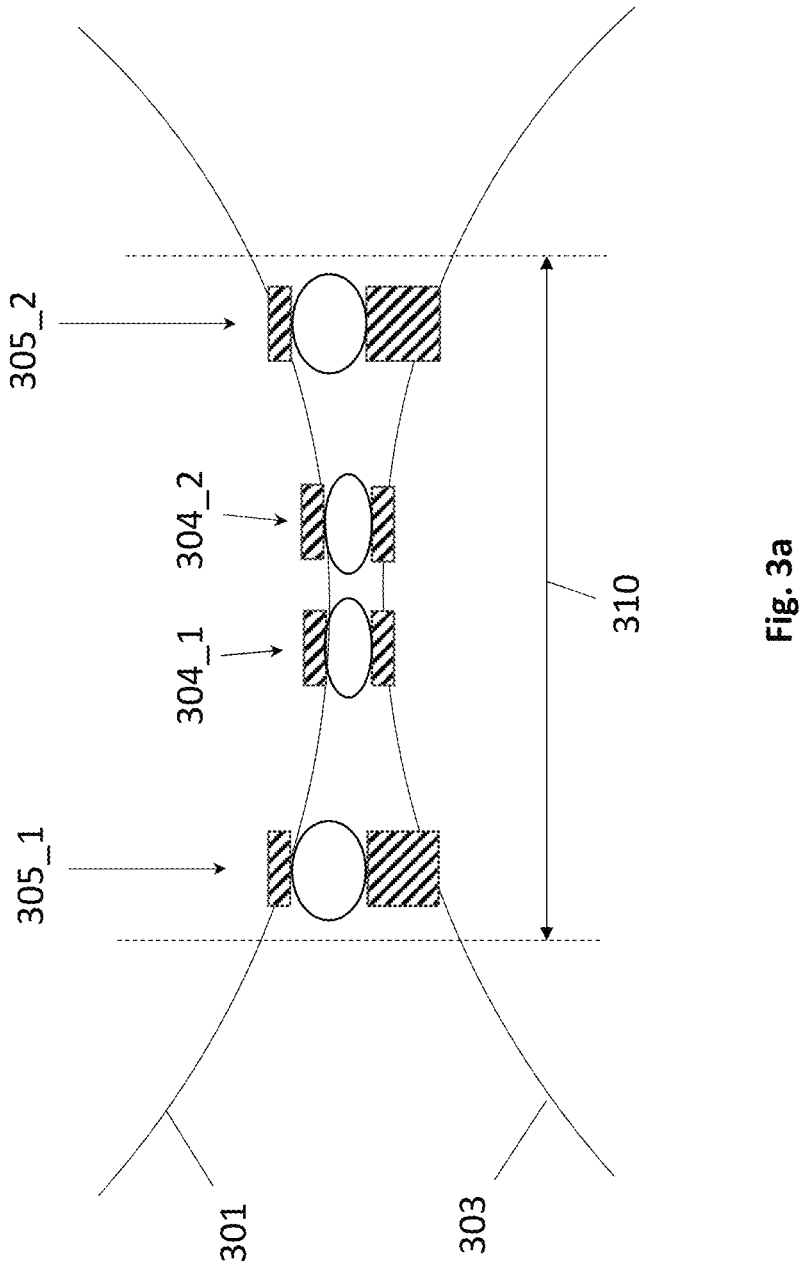
FIGS. 3a and 3b show I/O structures designed to compensate for warping of a semiconductor chip and a package substrate.

A solution, as observed in FIG. 3a, is to modulate the thickness of the pads and/or bumps on the package substrate to compensate for the expected warpage of the die and package substrate during the die attach process. As with FIG. 2, for ease of explanation, FIG. 3a is not to scale and the warping is exaggerated.

As observed in FIG. 3a, the middle I/Os 304_1, 304_2 have thin balls and pads, whereas, the outer I/Os 305_1, 305_2 have thick balls and pads. By modulating the pad and/or bump thicknesses in view of the expected warping of the package substrate 303 and die 301 during the die attach process, ideally, all of the die/substrate I/Os (including middle and outer I/Os) will be in appropriate contact with their die counterparts, as observed in FIG. 3a, so that each die/substrate I/O pair is properly formed.

Figure 3B:
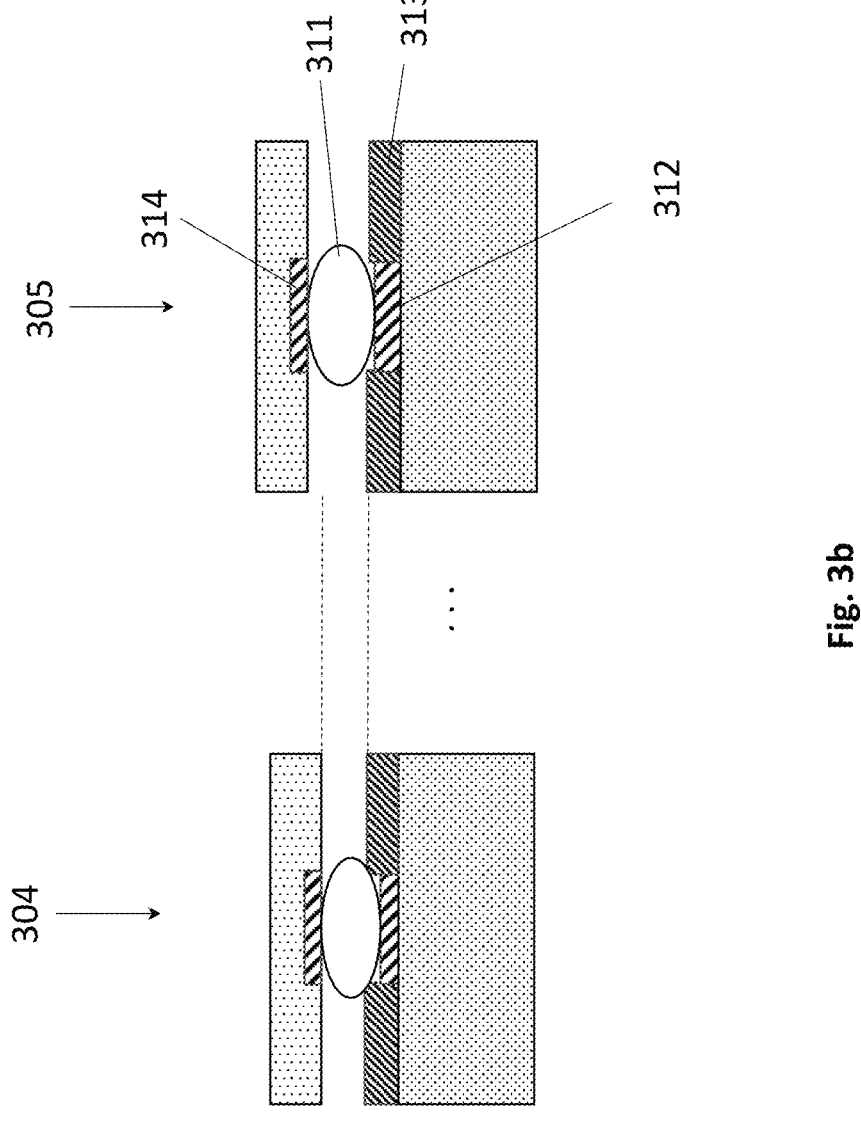

FIG. 3b shows a more realistic view of an inner I/O 304 and an outer I/O 305. As observed in FIG. 3b, the outer I/O 315 has a slightly thicker solder ball 311 and a slightly thicker substrate pad 312 than the corresponding ball and pad of the inner I/O 314. In various embodiments, the difference in thickness between the outer ball and inner ball, and/or, the outer pad and inner pad, is on the order of a few microns (e.g., 3μ, 5μ, 7μ, 10μ, etc.). As such, for instance, as observed in FIG. 3b, in various embodiments, the thicker I/O pad 312 remains beneath the top surface of the solder mask 313, and, the thicker solder ball 311 properly sits on the thicker pad 312 inside the cavity formed in the solder mask 313.

As indicated above, the precise strategy for modulating feature thicknesses depending on their inner/outer position can vary from embodiment. For example, in various embodiments, only the outer substrate pad 312 is thickened, only the outer solder ball is thickened 311 or both the outer substrate pad 312 and ball 311 are thickened. Additionally, consistent with the notion of applying gradual modulation from the inner I/Os to the outer I/Os, pads and/or balls of I/Os that are between the inner and outer I/Os can be thicker than the pads and/or balls of inner I/Os but thinner than the pads and/or balls of outer I/Os.

Further still, although FIGS. 3a and 3b only depict package substrate's pad 312 and ball 311 being thickened, in extended embodiments, perhaps to compensate for extreme warping, the die's pad 314 can also be thickened and/or the die's bump/ball (not shown) can be thickened (if the attach process includes a die side ball or ball/bump). In yet other alternative embodiments, at least one of the package substrate's pads and balls are not thickened, and instead, at least one of the die's pads and/or balls are thickened to compensate for the warpage.

For ease of discussion, most of the remaining discussion will focus on the original embodiment in which the package substrate's pads 312 and balls 311 are thickened.

In an embodiment, the steadily increasing pad and/or ball thickness variation moving from the middle region to the outer region is achieved by modulating electric current flow during electroplating of the package substrate pad and/or ball. Here, as is known in the art, electroplating is a material deposition process in which a material is deposited (e.g., copper in the case of pad formation and tin (Sn) in the case of solder ball formation) in a liquid bath where an electric current is made to run through the path.

Generally, the higher the electric current density, the higher the rate of deposition (more material is deposited per unit of time). By applying a higher deposition rate at the outer regions where thicker pads/balls are desired and a lower deposition rate at the inner regions where thinner pads/balls are desired, after a same deposition time period has passed for both regions, the outer regions that received a higher deposition rate will have thicker deposited material than the inner regions that received a lower deposition rate.

Figure 4A:
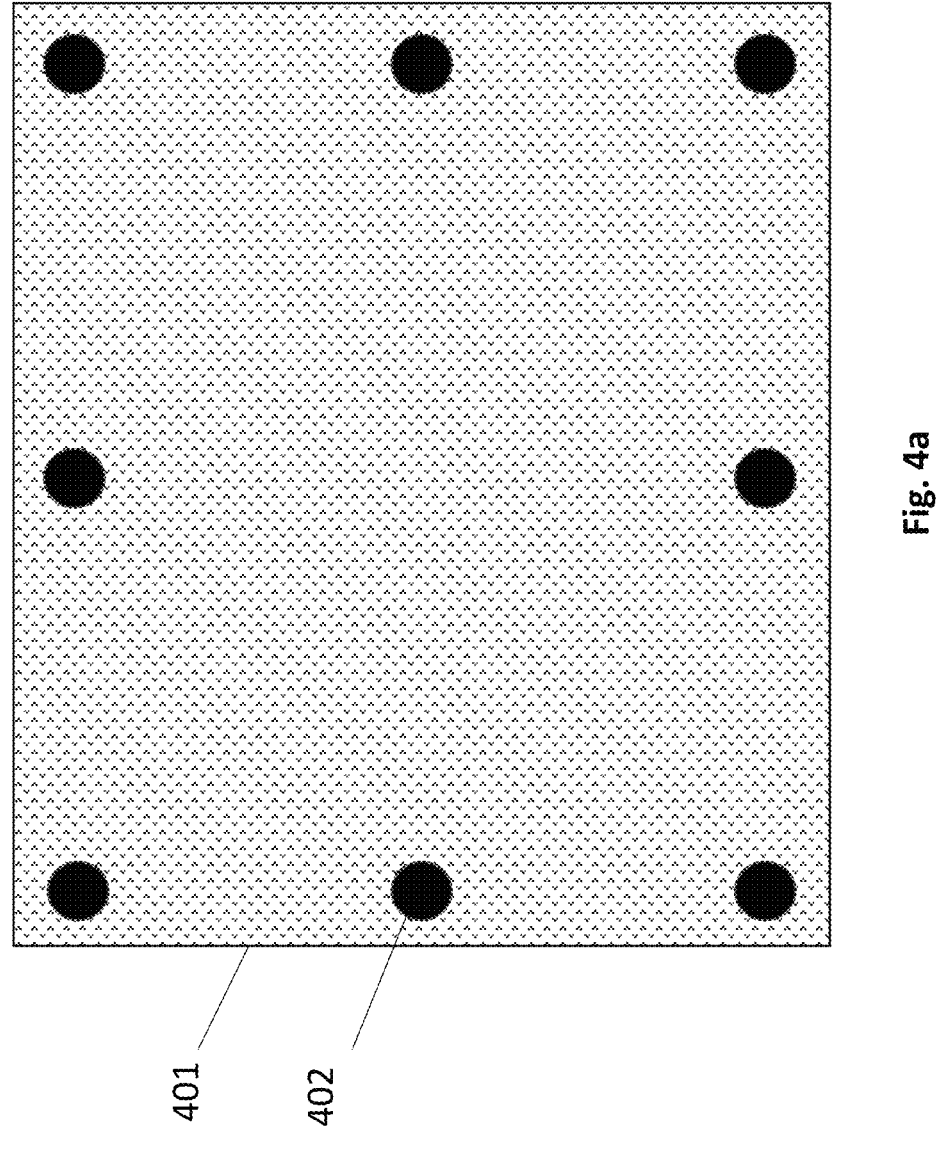
FIGS. 4a and 4b show a dielectric shield to be used in an electroplating bath.
Figure 4B:
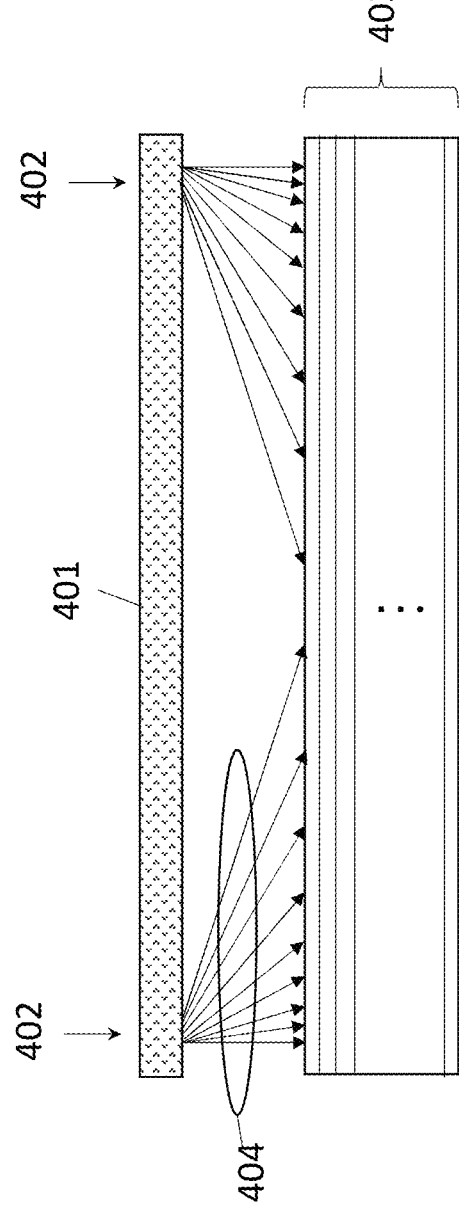

FIGS. 4a and 4b depict an embodiment of a dielectric shield 401 that can be inserted into the bath above the package substrate during the respective deposition processes of the pads and balls to steer electric current through the bath such that more electrical current flows in outer regions where a higher deposition rate is desired and less electric current flows in inner regions where a lesser deposition rate is desired.

Here, for pad formation, the top surface of the package substrate 403 is coated with a solder mask which is then patterned to have openings where the pads are to be formed. Once the pads are formed by a first electroplating process as described above, the solder balls are formed on top of the pads by a second electroplating process as described above.

FIG. 4a shows a top down view and FIG. 4b shows a side view. For ease of drawing FIGS. 4a and 4b only depict the portion of the package substrate 403 that is to reside beneath the semiconductor chip.

As observed in FIGS. 4a and 4b, the dielectric shield 401 has strategically placed holes 402 that force electrical field flux lines 404 within the bath to concentrate in outer regions where higher deposition rate is desired and diminish in inner regions where lesser deposition rate is desired (because the shield 401 is composed of dielectric material, the electric flux lines 404 can only flow through the holes 402 and not through the body of the shield 401). The concentrations of electric field flux lines 401 directly correlate to electric current density within the bath.

Thus, as can be seen (particularly in FIG. 4b), greater electric current density will exist in the outer regions as compared to the inner region. As such, the outer regions will exhibit higher deposition rates and thicker deposited material than the inner region.

To effect the electroplating, a DC voltage source is applied across the bath to establish an electric field within the bath that corresponds to the observed flux lines 404. A positive end of the voltage source is connected to a block mass of the material to be deposited (not shown) that also resides within the bath. The negative end of the voltage source is applied to circuit structures that are exposed by the openings in the substrate's solder mask and upon which the pads are to be electroplated. The electric flux lines 404 terminate on these circuit structures thereby causing deposition of the material upon them via electroplating.

Figures 5A, 5B:
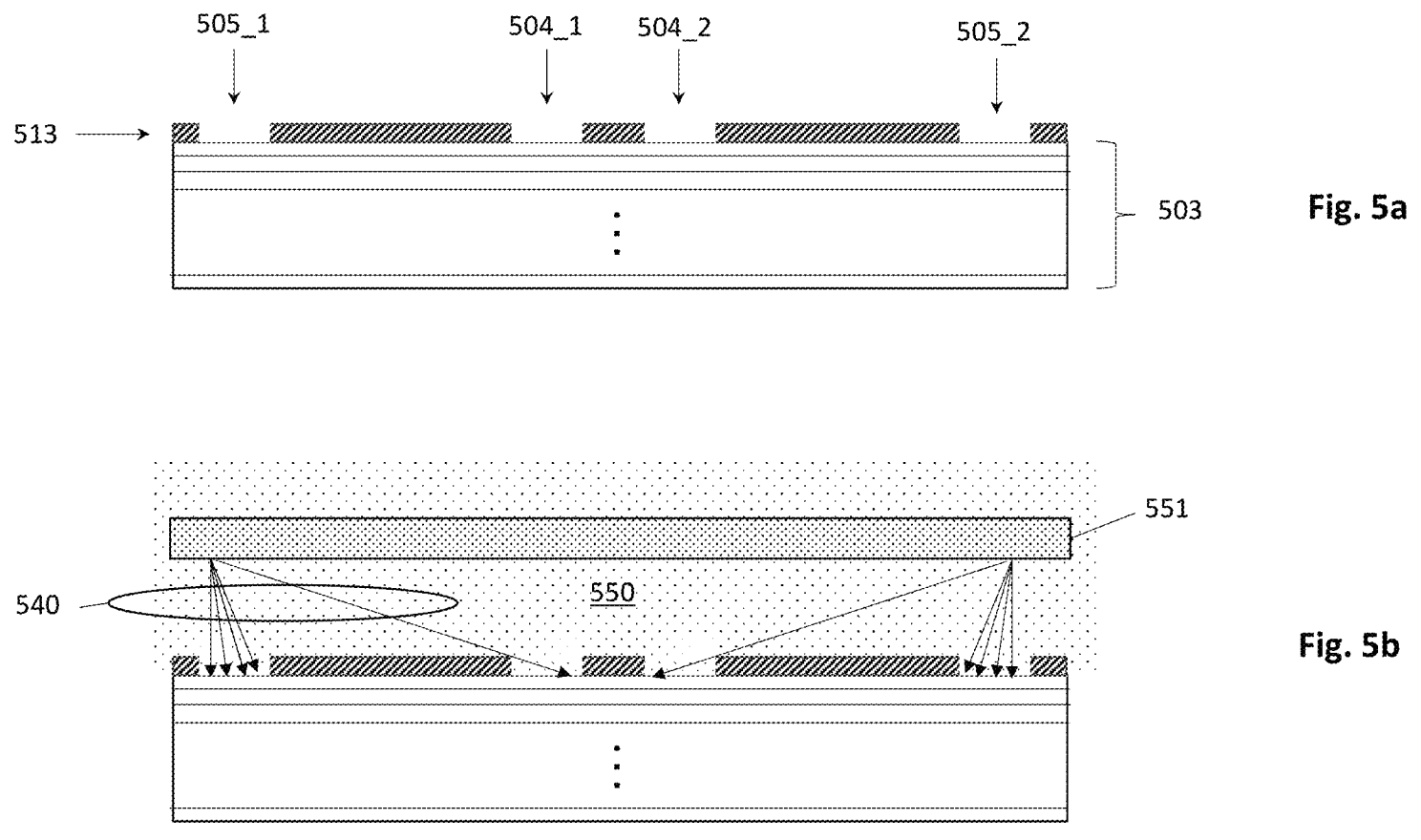
Figure 5C:
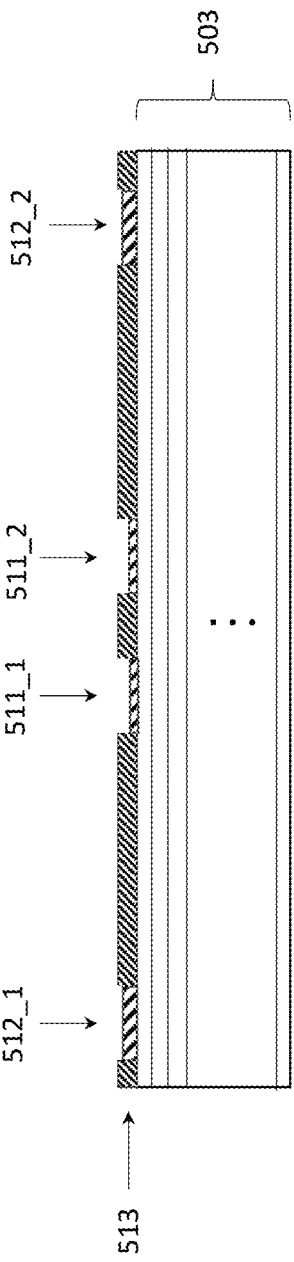
Figure 5D:
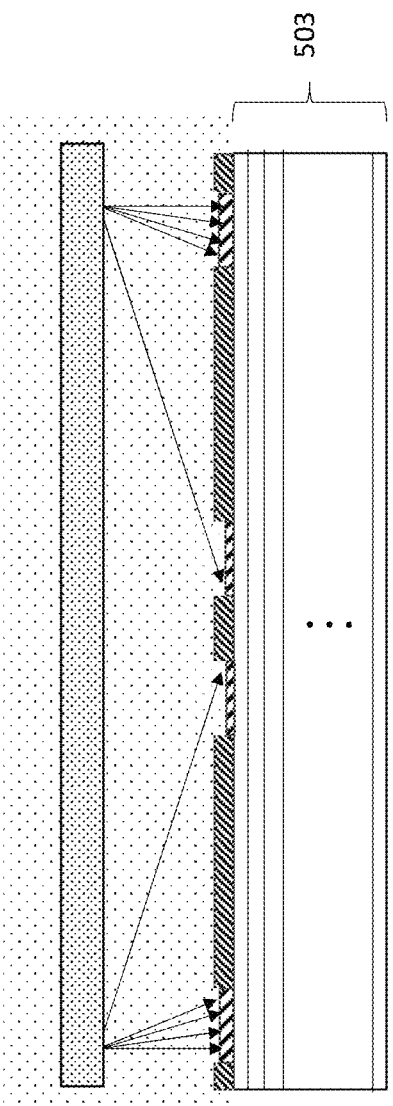

FIGS. 5a through 5e depict a method for manufacturing the pads and balls on a semiconductor chip package substrate according to the electroplating process described above. FIG. 5a depicts a package substrate 503 that is ready for pad formation. For ease of illustration, only the portion of the substrate 503 that is to reside beneath the semiconductor chip is depicted. A solder mask layer 513 is present on the surface of the package substrate 503. The solder mask layer 513 has been patterned to expose the specific areas on the package substrate where the pads are to be formed. For ease of illustration, openings are only shown for a pair of inner I/Os 504_1, 504_2 and a pair of outer I/Os 505_1, 505_2.

As observed in FIG. 5b, the package substrate is immersed in a bath 550 of electrolyte plating solution (e.g., copper sulfate) with a mass of copper material (not shown) and a dielectric shield 551 as discussed above. A direct current (DC) voltage is then established between circuit structures (lands connected to deeper wires) of the package substrate that are exposed by the openings in the solder mask layer 513 and the copper mass such that the exposed circuit structures are cathodes (−) and the copper mass is the anode (+).

The voltage creates electrical field flux lines 540 that run from the copper mass to the substrate's exposed circuit features. As discussed above with respect to FIG. 4b, the flux lines run through holes in the dielectric shield 551 that are designed to concentrate the flux lines above the peripheral regions of the substrate and divergently spread the flux lines above the middle regions of the substrate. Electrical current flows in the bath from the copper mass to the exposed wire features with a density that is proportional to the electrical flux lines.

As such, higher current densities flow into the exposed circuit features at the peripheral/outer regions of the substrate while lesser current densities flow into the exposed circuit features in middle/inner region of the substrate. Because deposition rate is proportional to current density, as observed in FIG. 5c, thicker pads of copper 512_1, 512_2 will be deposited on the peripheral/outer exposed circuit features and thinner pads of copper 511_1, 511_2 will be deposited on the middle/inner exposed circuit features.

As observed in FIG. 5d, the structure is again electroplated as described above but with a Sn mass (not shown) to electroplate Sn solder balls on the pads.

Figure 5E:
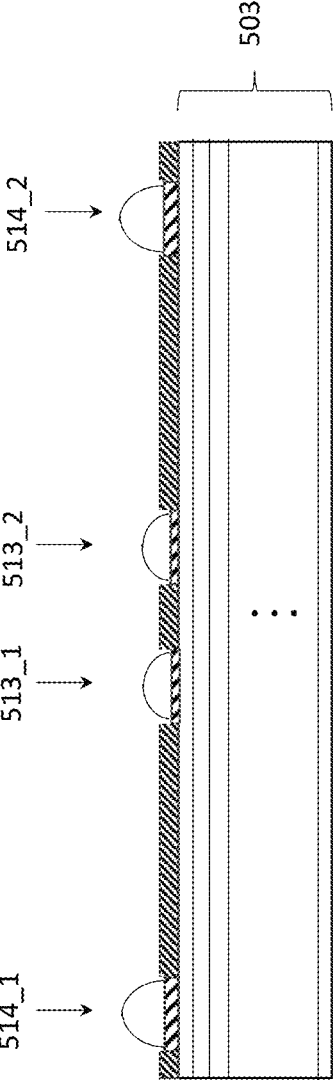

FIG. 5e shows the structure after the electroplating of the solder balls on the pads. As observed in FIG. 5e, the inner solder balls 513_1, 513_2 are thinner than the outer solder balls 514_1, 514_2.

The above discussion was primarily directed to a package design in which a semiconductor chip was placed directly on the package substrate. Although only a single chip was emphasized, the techniques discussed above can be applied to implementations where more than one chip is placed on the package substrate.

FIGS. 6a and 6b depict other package designs. As observed in FIG. 6a, an interposer 604 is placed upon the package substrate 603 and multiple semiconductor chips 605 are placed upon the interposer 604. The interposer 604 is a circuit board whose die side I/Os 607 are smaller than the package substrate's die side I/Os 605. The interposer 604 contains wiring structures to map the package substrate's die side I/Os 605 to the I/Os 606 of the semiconductor chips 605.

The interposer 604 can be used, e.g., in circumstances where the substrate's manufacturing process does not support the manufacturing of I/Os that are small enough to mate with the I/Os of the semiconductor chips 605, or, as a substrate for the semiconductor chips 605 to, e.g., support their shipment and attachment as a unit/module. Although more than multiple semiconductor chip 605 are shown in FIG. 6a, an interposer 604 can be used in packages having only semiconductor chip.

FIG. 6b shows the package of FIG. 6a but with an embedded semiconductor chip (ESC) 608 within the interposer 604. Here, the semiconductor chips 607 are to send very high speed signals between each another through extremely small I/Os. Because a semiconductor chip can be manufactured to have finer wire structures and I/Os than printed circuit boards, the ESC 608 has I/Os that can connect to the extremely small I/Os of the semiconductor chips 607 and contains fine pitched wires to transport the high speed signals between the semiconductor chips 607.

Notably, the warp compensation approach described above with respect to FIGS. 3a,b through 5a through 5e can be used at any of the interfaces mentioned including the interface 606 between the package substrate 603 and the interposer 604, the interface 607 between the interposer 604 and the semiconductor chips 605, and/or, the interface between the ESC 608 and the semiconductor chips 605.

Although copper (Cu) has been mentioned as the primary pad material in the teachings above, other metals can be electroplated and make use of the teachings above such as nickel, cobalt-iron, nickel-iron, nickel-cobolt or Cu alloys of these. Similarly, although tin (Sn) has been mentioned as the primary solder material in the teachings above other materials can be used as solder and electroplated to make use of the teachings above such as various alloys of Sn (e.g., tin-silver, tin-indium, tin-bismuth, tin-silver-copper, etc.).

FIG. 7 provides an exemplary depiction of a computing system 700 (e.g., a smartphone, a tablet computer, a laptop computer, a desktop computer, a server computer, etc.). As observed in FIG. 7, the basic computing system 700 may include a central processing unit 701 (which may include, e.g., a plurality of general purpose processing cores 715_1 through 715_X) and a main memory controller 717 disposed on a multi-core processor or applications processor, system memory 702 (also referred to as main memory), a display 703 (e.g., touchscreen, flat-panel), a local wired point-to-point link (e.g., USB) interface 704, various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_Y, one or more cameras 710, a battery 711, a power management control unit 712, a speaker and microphone 713 and an audio coder/decoder 714.

An applications processor or multi-core processor 750 may include one or more general purpose processing cores 715 within its CPU 701, one or more graphical processing units 716, a memory management function 717 (e.g., a memory controller) and an I/O control function 718 (e.g., I/O control hub or peripheral control hub (PCH)). The general purpose processing cores 715 typically execute the operating system and application software of the computing system. The graphics processing unit 716 typically executes graphics intensive functions to, e.g., generate graphics information that is presented on the display 703. The main memory controller 717 interfaces with the system memory 702 (also referred to as main memory) to write/read data to/from system memory 702.

The power management control unit 712 generally controls the power consumption of the system 700. Each of the touchscreen display 703, the communication interfaces 704-707, the GPS interface 708, the sensors 709, the camera(s) 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750. The computing system also includes non-volatile storage 720 which may be the mass storage component of the system (e.g., a hard disk drive, a solid state drive, etc.).

The computer system can include one or more packaged semiconductor chips whose chip package has internal I/O structures whose thickness is modulated to compensate for warpage as described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. An apparatus, comprising:

a substrate; and

I/O structures comprising pads and solder balls on the substrate to couple with a semiconductor chip, wherein a first subset of pads of the pads and solder balls in a first region of the substrate are thinner than a second subset of pads of the pads and solder balls in a second region of the substrate and wherein the substrate includes an embedded interconnect chip that is capable of interconnecting a first semiconductor chip on the substrate with a second semiconductor chip on the substrate.

2. The apparatus of claim 1 wherein the first subset of pads are inner pads.

3. The apparatus of claim 1 wherein the second subset of pads are outer pads of the pads and solder balls.

4. The apparatus of claim 1 wherein the first subset of pads of the pads and solder balls and the second subset of pads of the pads and solder balls are electroplated metal.

5. The apparatus of claim 1 wherein a first subset of balls of the pads and solder balls and a second subset of solder balls of the pads and solder balls are electroplated solder.

6. The apparatus of claim 1 wherein the substrate is-any of:

a package substrate;

an interposer; or a printed circuit board.

7. The apparatus of claim 1 wherein a first subset of solder balls of the pads and solder balls is thinner than a second subset of solder balls of the pads and solder balls.

8. The apparatus of claim 1 wherein the first subset of pads of the pads and solder balls and the second subset of pads of the pads and solder balls are located on the embedded interconnect chip.

9. A system comprising:

a plurality of processing cores;

a memory;

a memory controller coupled between the plurality of processing cores and the memory;

a network interface; and a second semiconductor chip, package comprising a first semiconductor chip and a semiconductor chip the semiconductor chip package comprising I/O structures, the I/O structures comprising pads and solder balls that are coupled to the first semiconductor chip, wherein a first subset of pads of the pads and solder balls are thinner than a second subset of pads of the pads and solder balls, wherein the semiconductor chip package also comprises a substrate, and wherein the substrate comprises an embedded interconnect chip that interconnects the first semiconductor chip with the second semiconductor chip.

10. The system of claim 9 wherein the first subset of pads of the pads and solder balls are inner pads of the pads and solder balls.

11. The system of claim 9 wherein the second subset of pads are outer pads of the pads and solder balls.

12. The system of claim 9 wherein the first subset of pads of the pads and solder balls and the second subset of pads of the pads and solder balls are electroplated metal.

13. The system of claim 9 wherein a first subset of solder balls of the pads and solder balls and a second subset of solder balls of the pads and solder balls are electroplated solder.

14. The system of claim 9 wherein the substrate is:

a semiconductor chip package substrate or an interposer.

15. The system of claim 9 wherein a first subset of solder balls of the pads and solder balls is thinner than a second subset of solder balls of the pads and solder balls.

16. The system of claim 9 wherein the first subset of pads of the pads and solder balls and the second subset of pads of the pads and solder balls are located on the embedded interconnect chip.

* * * * *